United States Patent [19]

Baumgartner et al.

[11] Patent Number: 4,638,191

[45] Date of Patent: Jan. 20, 1987

[54] AMPLITUDE INSENSITIVE DELAY LINE

[75] Inventors: Richard A. Baumgartner, Palo Alto; John N. Dukes, Los Altos Hills, both of Calif.; George A. Fisher, Andover, Mass.

[73] Assignee: Hewlett-Packard Company, Palo Alto, Calif.

[21] Appl. No.: 628,069

[22] Filed: Jul. 5, 1984

[51] Int. Cl.$^4$ ................. H03K 17/284; H03K 17/693
[52] U.S. Cl. .................................... 307/602; 307/443; 307/450; 307/606
[58] Field of Search .............. 307/605, 606, 602, 481, 307/480, 443, 450, 530

[56] References Cited

U.S. PATENT DOCUMENTS

| | | | |
|---|---|---|---|
| 3,553,484 | 1/1971 | Gassmann | 307/605 |
| 3,760,280 | 9/1973 | Covington . | |
| 3,973,138 | 8/1976 | Puckette et al. . | |
| 4,011,402 | 3/1977 | Koike et al. | 307/481 |
| 4,124,820 | 11/1978 | Arnstein . | |
| 4,408,168 | 10/1983 | Higuchi | 307/605 |
| 4,473,762 | 9/1984 | Iwahashi et al. | 307/443 |
| 4,489,342 | 12/1984 | Gollinger et al. | 307/605 |
| 4,491,747 | 1/1985 | Shimizu | 307/443 |
| 4,494,021 | 1/1985 | Bell et al. | 307/606 |
| 4,503,341 | 3/1985 | Shah | 307/443 |
| 4,535,259 | 8/1985 | Smarandoiu et al. | 307/530 |
| 4,593,203 | 6/1986 | Iwahashi et al. | 307/450 |

OTHER PUBLICATIONS

Electronics Engineers' Handbook by Fink McGraw-Hill Book Co., copyright 1982, pp. 16-16.

Phillip K. Hardage and Stephen W. Peurifoy, "Method and Apparatus for Delaying a Pulse", s/n 352,671, filed 2/26/82, Abandoned U.S. Patent Application.

H. Edward Karrer & Arthur M. Dickey, "Ultrasound Imaging: an Overview", Hewlett-Packard Journal, Oct. 1983, pp. 3-6.

Jonathan Taft, "A Digital Delay Line, Implemented in VLSI", abstract of talk given at MIT in Mar./Apr., 1983.

Heinz E. Kallmann, "Transversal Filters", Proceedings of the I.R.E., Jul. 1940, pp. 302-310.

Joseph F. Lutz, Synchronous Relay-Line Detector Provides Wideband Performance, Microwaves & RF, Nov. 1982, 71, 74, 75, 79.

A Novel Precision MOS Synchronous Delay Line by Mel Bazes, IEEE Journal of Solid-State Circuits, vol. SC-20, No. 6, Dec. 1985.

Primary Examiner—John S. Heyman
Attorney, Agent, or Firm—Douglas L. Weller

[57] ABSTRACT

A delay circuit comprising a plurality of cascaded saturating circuit elements is provided. The delay circuit may be incorporated in such circuits as modulators and demodulators to provide signal delay.

13 Claims, 9 Drawing Figures

AMPLITUDE INSENSITIVE DELAY LINE

BACKGROUND OF THE INVENTION

Analog signal processing applications often require the use of signal delay lines. Such delay lines can be categorized generally as either analog or digital in nature. A typical example of an analog delay line is that disclosed by Puckette et al. in U.S. Pat. No. 3,973,138 issued Aug. 3, 1976 which uses a bucket brigade of serially connected capacitors to provide a desired amount of time delay. Such analog delay lines are unfortunately relatively expensive, require the use of analog switches, and tend to suffer from crosstalk problems. In addition, either when used singly or when cascaded, such analog systems invariably reduce the bandwidth of the signal being processed.

A typical digital delay line is disclosed by Covington in U.S. Pat. No. 3,760,280 issued Sept. 18, 1973, in which a single analog signal channel is converted to a frequency modulated (FM) signal which in turn is delayed by means of a clocked digital shift register. The resulting delayed digital signal is then demodulated to provided a delayed analog signal. Such a digital delay system overcomes many of the problems of analog delay lines, but the bandwidth problem still remains. Since the digital signal is propagated through the shift register by means of a clock signal, it is necessary to use a very high speed shift register and clock to maintain the overall system bandwidth. Thus, according to conventional sampling signal theory, in order for the delayed output signal to have a 5 megahertz (MHz) information bandwidth with a 0.1% pulse width resolution, the shift register must be clocked at or above 10 gigahertz (GHz) (i.e., 5 MHz×1000×2).

Other workers such as Arnstein in U.S. Pat. No. 4,124,820 issued Nov. 7, 1978 have shown digital delay lines which do not make use of a clocked shift register, but instead achieve their desired delay function by applying an FM signal to a plurality of conventional digital gates arranged in cascade along with latch connected logic gates to reconstitute travelling through the delay circuit. Propagation delay is then adjusted by adding external timing capacitance or resistance to compensate for device variations. Although such an asynchronous delay line does not make use of a clock as in Covington, the resulting output signal is still bandwidth limited due to the low bandwidth of the individual digital gates, the use of latches to overcome propagation losses, and the use of resistors and capacitors to adjust the propagation delay.

SUMMARY OF THE INVENTION

In accordance with the preferred embodiments of the present invention, a delay circuit is presented for providing signal delay. In order to delay an analog signal, the analog signal is first represented by a binary signal with only two voltage states (a logic 1 and a logic 0). For example, this can be done by using the analog signal to pulse width modulate, frequency modulate or phase modulate a carrier wave to produce a modulated signal. The modulated signal can then be coupled to a plurality of cascaded saturating elements. Each saturating element provides an incremental delay. Delay across the delay circuit can be varied by providing a digital switching means which allows selection of the number of circuit elements through which the binary signal travels, by varying the period of delay through each element, or by a combination of the above two methods. After passing through the delay circuit the binary signal can then be restored by demodulation to the initial analog signal, without loss of bandwidth.

The delay circuit for providing signal delay may be incorporated in many types of devices. For instance, the delay circuit may be incorporated in a transversal filter to replace more conventional analog delays, in a wideband FM detector to provide phase shift, or in a phased array acoustic imaging system to align signals from array elements.

DESCRIPTION OF THE PREFERRED EMBODIMENT

Delay of a binary signal may be accomplished by coupling the signal through a series of saturating elements. What is meant by a binary signal is a signal which changes between two voltage levels. The voltage levels, commonly referred to as logic 0 and logic 1 may be, for example, 0 volts and 3 volts.

Figure 1:
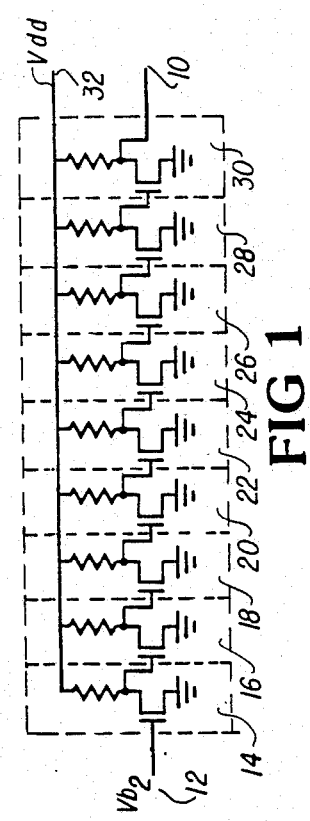
FIG. 1 is a schematic diagram of cascaded inverters in accordance with a preferred embodiment of the present invention.

In FIG. 1, a binary signal ($V_{b1}$) is applied to an input 12 of a plurality of cascaded saturating circuit elements, in this case inverters 14, 16, 18, 20, 22, 24, 26, 28, and 30. A supply voltage ($V_{dd}$), for example 3 volts, is coupled to the system at a node 32. In the preferred embodiment, each of the plurality of cascaded inverters has a propagation (or delay) time t of a few (e.g. 3-20) nanoseconds. At an output 10, the delay of the binary signal is equal to the number of inverters multiplied by the propagation time through each inverter. In the circuit of FIG. 1, this equals 9t.

Figure 2:
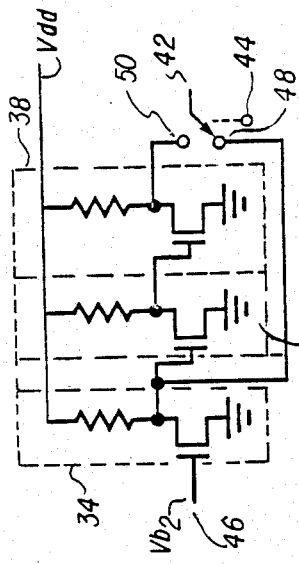
FIG. 2 shows a circuit which uses a switch to vary propagation time through the circuit.

In FIG. 2, a binary signal ($V_{b2}$) is coupled at an input 46 to a plurality of cascaded inverters 34, 36, and 38. An output 42 is coupled to a node 50 or a node 48. A single-pole-double-throw switch 44 or its logic equivalent toggles output 42 between node 50 and node 48, and thus varies the duration of delay from input 46 to output 42. For example, if each of the cascaded inverters has a propagation time t, the delay when output 42 is coupled to node 48 is t and the delay when output 42 is coupled to node 50 is 3t.

Figure 3:
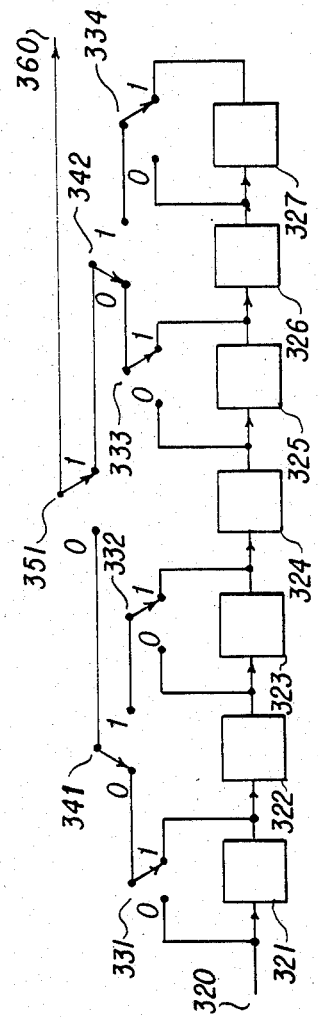
FIG. 3 shows a circuit which varies propagation delay from an input to an output by means of switches organized in the form of a binary tree.

In FIG. 3, an example is shown of a means to vary delay propagation by digital switching utilizing a binary tree. A binary signal is coupled at an input 320 to a plurality of delay elements 321, 322, 323, 324, 325, 326, and 327, typically groups of cascaded inverters as in FIGS. 1 and 2. Typically, when fabricated on a single integrated circuit, delay time T will be the same for each delay element group 321-327. A series of logic switches 331, 332, 333, 334, 341, 342, and 351, which are typically single-pole-double-throw switches or their logic equivalent, are arranged in the form of a binary propagation time through the entire circuit. Depending upon the position of switches 331-334, 341-342, and 351, the range of propagation delay from input 320 to an output 360 is 0T to 7T. In the circuit of FIG. 3 there are 3 levels of switches: switch 351 forms the first level; switches 341 and 342 form the second level; and switches 331, 332, 333, and 334 form the third order level. The switches at each level for convenience, may be switched together. For instance, as shown in FIG. 3, third level switches 331, 332, 333, and 334 are each selecting a pole labeled "1".

In the embodiment shown in FIG. 3 each level of switches represents a bit in a binary number. Level 1 is the most significant bit, level 2 is the next most significant bit, and level 3 is the least significant bit, e.g., in FIG. 3 level 1 switch 351 is set at "1", level 2 switches 341-342 are set at "0", and level 3 switches 331-334 are set at "1", so that the current delay is $101_{base\ 2}$ times T, that is 5T.

Figure 4:
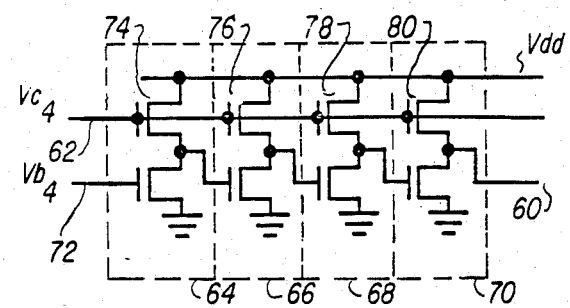
FIG. 4 shows a circuit which varies propagation delay by means of an analog signal.

In FIG. 4, an alternative method to vary delay is illustrated. A binary signal (Vb4) is coupled at an input 72 to a plurality of saturating elements, 64, 66, 68, and 70, typically cascaded inverters, as shown. Variable resistors 74, 76, 78, and 80, for example depletion-type metal-oxide-silicon field effect transistors (MOSFETS), are controlled by a voltage (Vc4) applied to an input 62 and function as variable current sources. Although delay time t varies as Vc4 varies, typically, when Vc4 is held constant, delay time t will be the same for each saturating element 64, 66, 68, and 70, when saturating elements 64, 66, 68, and 70 are fabricated on a single integrated circuit. Delay from input 72 to output 60, therefore, is always 4t. When Vc4 is decreased, resistance across each of variable resistors 74, 76, 78, and 80 increases, decreasing current through variable resistors 74, 76, 78, and 80 and thereby increasing the propagation (delay) time t of each of the saturating elements 64, 66, 68, and 70. Correspondingly, as Vc4 is decreased, propagation time t decreases. Therefore, varying Vc4 varies the delay from input 72 to output 60.

Figure 5A:
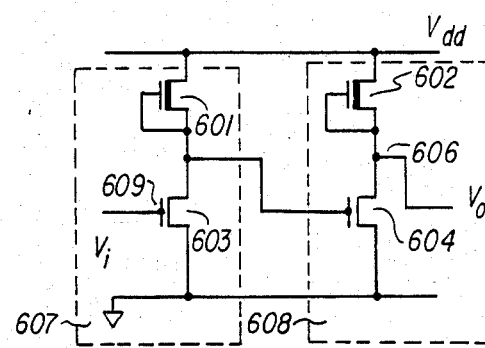
FIGS. 5A-5B show the coupling of two inverters to form a delay stage.

FIGS. 5A-5E illustrate the coupling of two inverters on an integrated circuit. FIG. 5A shows a circuit where an inverter 607, comprising an enhancement-type MOSFET 603 and a depletion-type MOSFET 601, is coupled as shown to an inverter 608, comprising an enhancement-type MOSFET 604 and a depletion-type MOSFET 602. MOSFETs 601 and 602 act as load resistances for inverters 607 and 608. An input node 609 is coupled to an output node of a prior inverter. An output node 606 is coupled to an input of a subsequent inverter. As can be seen from FIG. 5A, signal Vo on output 606 is the same as a voltage Vi on input 609 after a propagation delay through inverter 607 and a propagation dely through inverter 608. On this circuit experimental results showed a ratio of rise to fall time to be at least 3:1. What is meant by rise time is the time it takes for signal Vo to rise from logic 0 to logic 1 after signal Vo starts to rise from logic 0 to logic 1. What is meant by fall time is the time it takes for signal Vo to fall from logic 1 to logic 0 after signal Vo starts its fall from logic 1 to logic 0. The asymmetry in rise to fall times makes it difficult to propagate high frequency pulse trains through a string of inverters, coupled as in the circuit in FIG. 5A, without distortion of the timing between pulses.

Figure 5B:
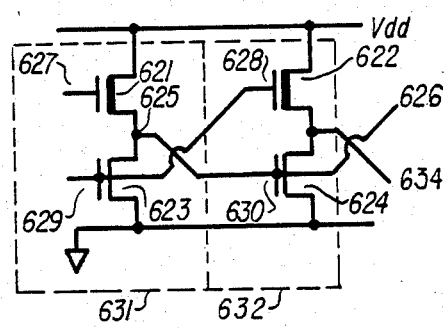

In FIG. 5B an inverter 631, comprising an enhancement-type MOSFET 623 and a depletion-type MOSFET 621, is coupled as shown to an inverter 632, comprising an enhancement-type MOSFET 624 and a depletion-type MOSFET 622. MOSFETs 621 and 622 act as variable load resistances. An input node 629 and an input node 627 are coupled to output nodes of a prior inverter. An output node 626 and an output node 634 are coupled to inputs of a subsequent inverter. As shown in FIG. 5B, input 629 is coupled to MOSFET 623, and is also coupled to a gate 628 of MOSFET 622. Similarly a node 625 of inverter 631 is coupled to MOSFET 624 at a gate 630, and is also coupled to output node 626. The rise to fall ratio from input 629 to output 634 for the circuit of FIG. 5B was found to be about 1.5:1. This characteristic makes the circuit in FIG. 5B better qualified than the circuit in FIG. 5A to propagate high frequency pulse trains.

Figure 5C:
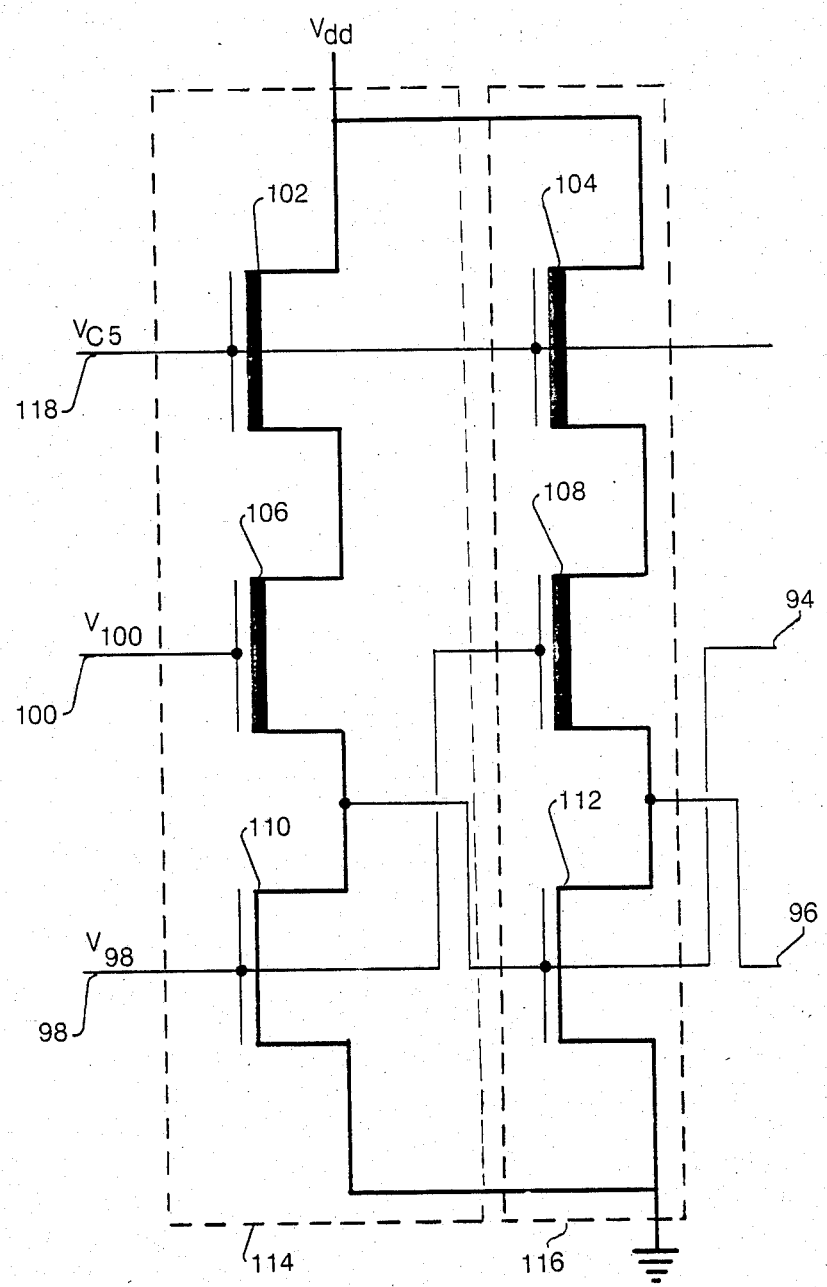
FIGS. 5C-5E show the coupling of two inverters to form a delay stage in accordance with preferred embodiments of the present invention.

FIG. 5C shows a circuit where two inverters, 114 and 116 are coupled. Varying a voltage Vc5 applied to an input 118 varies resistance across a depletion-type MOSFET 102 and a depletion-type MOSFET 104 which both function as variable current sources An input node 98 and an input node 100 are coupled to outputs nodes of a prior inverter. A voltage V100 on input node 100 is an inverse of a voltage v98 on input node 98, i.e., when v98 is at logic 1, then V100 is logic 0, and vice-versa. A depletion-type MOSFET 106 and an enhancement-type MOSFET 110 of inverter 114, are coupled as shown to a depletion-type MOSFET 108 and an enhancement-type MOSFET 112 of inverter 116. An output node 94 and an output node 96 are then available to be coupled to a succeeding inverter.

The major difference between the circuit in FIG. 5B and the circuit in FIG. 5C is the addition of MOSFETs 102 and 104. These MOSFETs were added in inverters 114 and 116, and similar MOSFETs may be added to every inverter in a series of cascaded inverters, to vary the delay time across each inverter by controlling the current through the inverters. This capacity to vary delay time can be used to standardize propagation time between integrated circuits. Propagation time through integrated circuits may vary because of process variations in the process used to fabricate the integrated circuit. Process variations may include variations in doping density for depletion mode load devices, variations in gate geometries for small geometry devices, and environmental variations, such as variations in temperature.

Figure 5D:
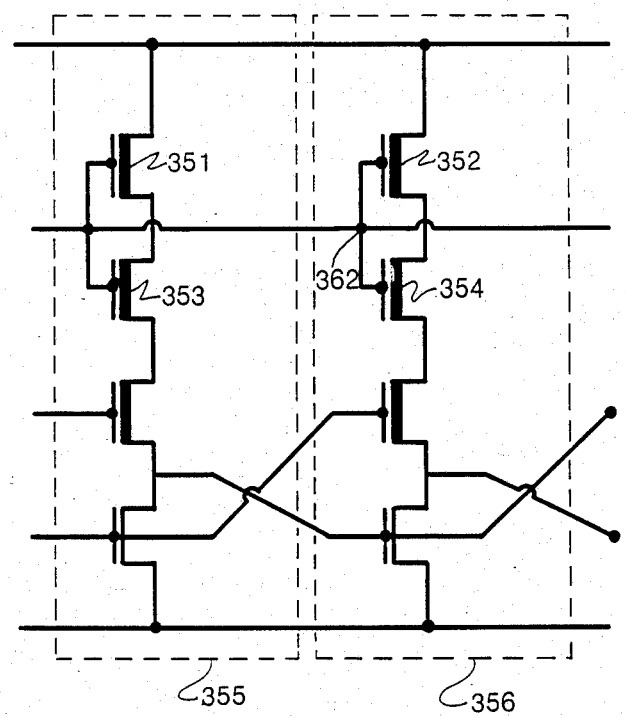
Figure 5E:
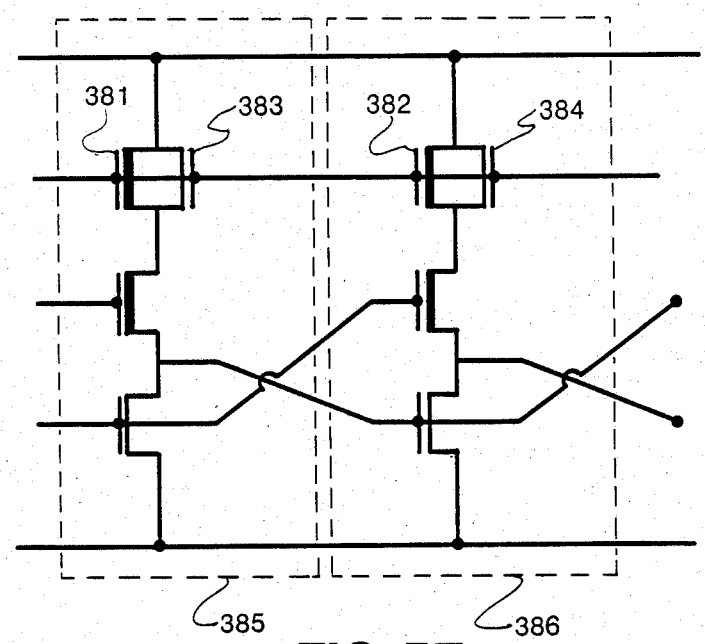

FIGS. 5D and 5E illustrate alternative embodiments for coupling inverters. These embodiments allow for compensation for for wide variation in propagation time resulting from process variations, without impingement on other inverter performance parameters. In FIG. 5D each inverter 355 and 356 has two depletion-type MOSFETS—MOSFETS 351 and 353 in inverter 355, and MOSFETs 352 and 354 in inverter 356—coupled in series to provide time delay variation through current control. In FIG. 5E each inverter 385 and 386 has one depletion-type MOSFET 381 and an enhancement-type MOSFET—a depletion-type MOSFET 381 and an enhancement-type MOSFET 383 in inverter 385 and a depletion-type MOSFET 382 and an enhancement-type MOSFET 384 in inverter 386—coupled in parallel to provide time delay variance through current control.

What is claimed is:

1. A circuit for delaying a signal comprising a plurality of cascaded saturating circuit elements wherein each element in the plurality of cascaded saturating circuit elements comprises:

control means for varying delay through the element, the control means having a first node coupled to a voltage source, a second node and a third node wherein a signal may be placed on the third node in order to vary delay through the element;

a first depletion-type MOSFET including a drain node coupled to the second node of the control means, a gate node coupled to a prior element and a source node coupled to a subsequent element;

a first enhancement-type MOSFET including a drain node coupled to the source node of the first depletion-type MOSFET, a source node coupled to ground, and a gate node coupled to the prior element and to a gate note of a depletion-type MOSFET in the subsequent element.

2. A circuit as in claim 1 wherein:
the control means comprises a second depletion-type MOSFET;
the first node is a drain node;
the second node is a source node; and,
the third node is a gate node.

3. A circuit as in claim 2 wherein the gate node of the second depletion-type MOSFET is coupled to a node of a control means in the preceeding element and is coupled to a node of a control means in the subsequent element.

4. A circuit as in claim 1 wherein the control means comprises:
a second depletion-type MOSFET having a drain node which is the first node, a source node, and a gate node which is the third node; and,
a third depletion-type MOSFET having a drain node coupled to the source node of the second depletion-type MOSFET, a source node which is the second node, and a gate node coupled to the gate node of the second depletion-type MOSFET.

5. A circuit as in claim 4 wherein the third node is coupled to a node of a control means in the preceeding element and is coupled to a node of a control means in the subsequent element.

6. A circuit as in claim 1 wherein the control means comprises:
a second depletion-type MOSFET having a drain node which is the first node, a source node which is the second node and a gate node which is the third node; and,
a second enhancement-type MOSFET having a drain node coupled to the drain node of the second depletion-type MOSFET, a source node coupled to the source node of the second depletion-type MOSFET, and a gate node coupled to the gate node of the second depletion-type MOSFET.

7. A circuit as in claim 6 wherein the third node is coupled to a node of a control means in the preceeding element and is coupled to a node of a control means in the subsequent element.

8. A circuit for delaying a signal comprising:
a plurality of cascaded saturating circuit elements;
an input means for coupling the signal to the plurality of cascaded saturating circuit elements;
an output means for coupling the signal to a subsequent circuit; and
control means coupled to the plurality of cascaded saturating circuit elements for varying the length of time the signal is delayed, the control means comprising
a plurality of taps at intervals of delay along the plurality of cascaded saturating circuit elements, and
a switching means coupled to the plurality of taps and to the output means for allowing external selection of a tap from the plurality of taps to be coupled to the output means, the switching means comprising layers of switches wherein:
a first layer of switches comprises a first plurality of logic switches each switch having a first input pole coupled to a first tap of the plurality of taps, a second input pole coupled to a second tap of the plurality of taps, and an output node;
a second layer of switches comprises a second plurality of logic switches each switch having a first input pole coupled to a first output node of a switch from the first plurality of logic switches, a second input pole coupled to a second output node of a switch from the first plurality of logic switches, and an output node; and,
a last layer of switches comprising a logic switch having a first pole coupled to a first output node of a switch from a prior layer of switches, a second pole coupled to a second output node of switch from the prior layer of switches, and an output node coupled to the output means.

9. A circuit as in claim 8 wherein the plurality of taps are at equal intervals of delay.

10. A circuit for delaying a signal comprising a plurality of cascaded saturating circuit elements wherein each element in the plurality of cascaded saturating circuit elements comprises:
an inverter;
control means for varying the length of delay through the inverter, the control means comprising
a first depletion-type MOSFET having a first node coupled to a voltage source, a second node and a third node on which may be placed a signal in order to vary delay through the inverter
a second depletion-type MOSFET having a first node coupled to the inverter, a second node which is coupled to the second node of the first depletion-type MOSFET, and a third node coupled to the third node of the first depletion-type MOSFET.

11. A circuit as in claim 10 wherein the third node of the first depletion-type MOSFET is coupled to a node of a control means in the preceeding element and is coupled to a node of a control means in the subsequent element.

12. A circuit for delaying a signal comprising a plurality of cascaded saturating circuit elements wherein each element in the plurality of cascaded saturating circuit elements comprises:
an inverter;
control means for varying the length of dely through the inverter, the control means comprising
a depletion-type MOSFET having a first node coupled to a voltage source, a second node coupled to the inverter and a third node on which may be placed a signal in order to vary delay through the inverter, and
an enhancement-type MOSFET having a first node coupled to the first node of the depletion-type MOSFET, a second node coupled to the second node of the depletion-type MOSFET, and a third node coupled to the third node of the depletion-type MOSFET.

13. A circuit as in claim 12 wherein the third node of the depletion-type MOSFET is coupled to a node of a control means in the preceeding element and is coupled to a node of a control means in the subsequent element.

* * * * *